US012713831B2

(12) United States Patent
Sangle et al.

(10) Patent No.: US 12,713,831 B2
(45) Date of Patent: Aug. 18, 2026

(54) FABRICATION OF PIEZOELECTRIC DEVICE WITH PMNPT LAYER

(71) Applicant: Applied Materials, Inc, Santa Clara, CA (US)

(72) Inventors: Abhijeet Laxman Sangle, Aurangabad (IN); Vijay Bhan Sharma, Rajasthan (IN); Yuan Xue, Xi'an City (CN); Uday Pai, San Jose, CA (US); Bharatwaj Ramakrishnan, San Jose, CA (US); Ankur Kadam, Thane (IN)

(73) Assignee: Applied Materials, Inc., Santa Clara, CA (US)

( * ) Notice: Subject to any disclaimer, the term of this patent is extended or adjusted under 35 U.S.C. 154(b) by 534 days.

(21) Appl. No.: 16/691,570

(22) Filed: Nov. 21, 2019

(65) Prior Publication Data

US 2021/0143320 A1 May 13, 2021

(30) Foreign Application Priority Data

Nov. 12, 2019 (CN) ......................... 201911101682.4

(51) Int. Cl.
*H01L 41/319* (2013.01)
*H01L 41/047* (2006.01)
(Continued)

(52) U.S. Cl.
CPC ........... *H10N 30/079* (2023.02); *H10N 30/06* (2023.02); *H10N 30/076* (2023.02);
(Continued)

(58) Field of Classification Search
CPC ..... H01L 41/29; H01L 41/316; H01L 41/319; H01L 41/0477; H01L 41/0815;
(Continued)

(56) References Cited

U.S. PATENT DOCUMENTS 5,077,270 A 12/1991 Takeda et al.
5,338,999 A 8/1994 Ramakrishnan et al.
(Continued)

FOREIGN PATENT DOCUMENTS

CN 1811008 A 8/2006
CN 110225995 A 9/2019
(Continued)

OTHER PUBLICATIONS

Aoki et al, "Effects of titanium buffer layer on lead-zirconate-titanate crystallization processes in sol-gel deposition technique." J. Applied Physics, Jan. 1995, 34(1R):192-195.
(Continued)

*Primary Examiner* — Emily P Pham
*Assistant Examiner* — Monica Mata
(74) *Attorney, Agent, or Firm* — Fish & Richardson P.C.

(57) ABSTRACT

A piezoelectric device includes a substrate, a thermal oxide layer on the substrate, a metal or metal oxide adhesion layer on the thermal oxide layer, a lower electrode on the metal oxide adhesion layer, a seed layer on the lower electrode, a lead magnesium niobate-lead titanate (PMNPT) piezoelectric layer on the seed layer, and an upper electrode on the PMNPT piezoelectric layer.

12 Claims, 2 Drawing Sheets

(51) Int. Cl.

| | |
|---|---|
| ***H01L 41/08*** | (2006.01) |
| ***H01L 41/187*** | (2006.01) |
| ***H01L 41/29*** | (2013.01) |
| ***H01L 41/316*** | (2013.01) |
| ***H10N 30/00*** | (2023.01) |
| ***H10N 30/06*** | (2023.01) |
| ***H10N 30/076*** | (2023.01) |
| ***H10N 30/079*** | (2023.01) |
| ***H10N 30/853*** | (2023.01) |
| ***H10N 30/87*** | (2023.01) |

(52) U.S. Cl.
CPC ....... *H10N 30/708* (2024.05); *H10N 30/8548* (2023.02); *H10N 30/877* (2023.02)

(58) Field of Classification Search
CPC .. H01L 41/1875; H10N 30/06; H10N 30/076; H10N 30/079; H10N 30/877; H10N 30/8548; H10N 30/10516
USPC .......................................................... 310/358
See application file for complete search history.

(56) References Cited

U.S. PATENT DOCUMENTS

| | | | |
|---|---|---|---|
| 5,548,475 A | 8/1996 | Ushikubo et al. | |
| 6,097,133 A | 8/2000 | Shimada et al. | |
| 6,287,435 B1 | 9/2001 | Drewery et al. | |
| 6,294,860 B1 | 9/2001 | Shimada et al. | |
| 7,350,904 B2 | 4/2008 | Noguchi et al. | |
| 8,857,248 B2 | 10/2014 | Shih et al. | |
| 8,963,404 B2 | 2/2015 | Lee et al. | |
| 9,274,087 B2 | 3/2016 | Shih et al. | |
| 11,489,105 B2 | 11/2022 | Sangle et al. | |
| 2002/0136893 A1 | 9/2002 | Schlesinger | |
| 2003/0164137 A1* | 9/2003 | Han | C30B 11/00 117/81 |
| 2004/0163944 A1 | 8/2004 | Oshmyansky et al. | |
| 2004/0189751 A1 | 9/2004 | Kanno et al. | |
| 2004/0227227 A1* | 11/2004 | Imanaka | H01L 23/49822 257/692 |
| 2007/0002103 A1 | 1/2007 | Wasa et al. | |
| 2007/0046154 A1 | 3/2007 | Ifuku et al. | |
| 2008/0062228 A1 | 3/2008 | Saito | |
| 2008/0118661 A1 | 5/2008 | Watanabe et al. | |
| 2009/0072673 A1 | 3/2009 | Fujii et al. | |
| 2009/0307885 A1 | 12/2009 | Nihei | |
| 2010/0141097 A1 | 6/2010 | Li et al. | |
| 2010/0206713 A1 | 8/2010 | Li et al. | |
| 2010/0206714 A1 | 8/2010 | Li et al. | |
| 2010/0206718 A1 | 8/2010 | Li et al. | |
| 2010/0213795 A1 | 8/2010 | Li et al. | |
| 2011/0215677 A1 | 9/2011 | Jiang et al. | |
| 2012/0206019 A1 | 8/2012 | Noda et al. | |
| 2012/0306322 A1 | 12/2012 | Cueff et al. | |
| 2013/0093290 A1* | 4/2013 | Fox | H10N 30/10516 310/357 |
| 2013/0101750 A1 | 4/2013 | Yang et al. | |
| 2013/0284589 A1 | 10/2013 | Li et al. | |
| 2013/0320481 A1* | 12/2013 | Beratan | G01J 5/34 257/467 |
| 2013/0334930 A1 | 12/2013 | Kang et al. | |
| 2014/0264747 A1* | 9/2014 | Barabash | H01L 21/02356 257/532 |
| 2015/0047975 A1 | 2/2015 | West et al. | |
| 2015/0084486 A1 | 3/2015 | Eguchi | |
| 2016/0254439 A1* | 9/2016 | Potrepka | H01L 41/0815 204/192.18 |
| 2017/0148974 A1* | 5/2017 | Yonemura | B41J 2/14201 |
| 2018/0051368 A1 | 2/2018 | Liu et al. | |
| 2018/0209035 A1 | 7/2018 | Liu et al. | |
| 2018/0275485 A1 | 9/2018 | Hurwitz | |
| 2019/0210881 A1* | 7/2019 | Tung | C01B 32/186 |
| 2019/0214541 A1 | 7/2019 | Fujii et al. | |
| 2019/0245509 A1 | 8/2019 | Hurwitz | |
| 2023/0032638 A1 | 2/2023 | Sangle et al. | |

FOREIGN PATENT DOCUMENTS

| | | |
|---|---|---|
| TW | 201621585 | 6/2016 |
| TW | 201810744 | 3/2018 |
| TW | 201820625 | 6/2018 |
| WO | WO 2021/096867 | 5/2021 |
| WO | WO 2022/151472 | 7/2022 |

OTHER PUBLICATIONS

Bose et. al., "Role of TiO2 Seed Layer Thickness on the Nanostructure Evolution and Phase Transformation Behavior of Sputtered PZT Thin Films During Post-Deposition Air-Annealing" J. American Ceramic Society, Nov. 2011, 94(11):4066-77.

Office Action in Taiwanese Appln. No. 109138581, dated Jul. 2, 2021, 14 pages (with English translation).

PCT International Search Report and Written Opinion in International Appln. No. PCT/US2020/059881, dated Feb. 26, 2021, 10 pages.

Extended European Search Report in Appln. No. 20886854.7, dated Nov. 7, 2023, 7 pages.

Shinozaki et al., "Fabrication and optical properties of Pb(Mg(1/3)Nb(2/3))O(3)-PbTiO(3) thin films on Si substrates using the PLD method," IEEE Transactions on Ultrasonics, Ferroelectrics, and Frequency Control, May 2008, 55(5):1023-1028.

Office Action in European Appln. No. EP 20886854.7, dated Sep. 16, 2024, 5 pages.

Office Action in Chinese Appln. No. 201911101682.4, mailed Jul. 9, 2025, 13 pages (with English Translation).

Wang et al., "Effect of titanium dioxide (TiO2) seed layer on the phase composition of 0.7Pb (Mg1/3Nb2/3)O3-0.3PbTiO3 film prepared by pulsed laser deposition," Microelectronic Engineering, Sep. 2008, 85(9):1920-1923 (Abstract only).

* cited by examiner

Controller
150
112
126
Target 110
136
102
116
10
Power Source
108
100
Power Source
124
101
106
104
Gas
Vacuum

FABRICATION OF PIEZOELECTRIC DEVICE WITH PMNPT LAYER

TECHNICAL FIELD

This invention relates to fabrication of piezoelectric devices, and more particularly to piezoelectric devices that include PMNPT as the piezoelectric layer.

BACKGROUND

Piezoelectric materials have been used for several decades in a variety of technologies, e.g., ink jet printing, medical ultrasound and gyroscopes. Conventionally, piezoelectric layers are fabricated by producing a piezoelectric material in a bulk crystalline form and then machining the material to a desired thickness, or by using sol-gel techniques to deposit the layer. Lead zirconate titanate (PZT), typically of the form $Pb[Zr_xTi_{1-x}]O_3$, is a commonly used piezoelectric material. Sputtering of PZT has been proposed.

More recently relaxor-lead titanate (relaxor-PT) materials, such as lead magnesium niobate-lead titanate (PMNPT), typically $(1-x)[Pb(Mg_{1/3}Nb_{2/3})O_3]-x[PbTiO_3]$, as well as lead yttrium niobate-lead titanate (PYN-PT) such as $(1-X)[Pb(Y_{1/3}Nb_{2/3})O_3]-X[PbTiO_3]$, lead zirconium niobate-lead titanate (PZN-PT) such as $(1-X)[Pb(Zr_{1/3}Nb_{2/3})O_3]-X[PbTiO_3]$, and lead indium niobate-lead titanate (PIN-PT) such as $(1-X)[Pb(In_{1/3}Nb_{2/3})O_3]-X[PbTiO_3]$, have been proposed as piezoelectric materials. PMNPT can offer improved piezoelectric properties over the more commonly used PZT material. However, large area thin film deposition of a PMNPT layer in a commercially viable manner has been not yet been demonstrated.

SUMMARY

In one aspect, a piezoelectric device includes a substrate, a thermal oxide layer on the substrate, a metal or metal oxide adhesion layer on the thermal oxide layer, a lower electrode on the metal oxide adhesion layer, a seed layer on the lower electrode, a lead magnesium niobate-lead titanate (PMNPT) piezoelectric layer on the seed layer, and an upper electrode on the PMNPT piezoelectric layer.

In another aspect, a method of fabricating a piezoelectric device includes forming an adhesion layer on a thermal layer of a substrate, depositing a lower electrode on the adhesion layer, forming a seed layer on the lower electrode, depositing a lead magnesium niobate-lead titanate (PMNPT) piezoelectric layer on the seed layer by physical vapor deposition, and depositing an upper electrode on the PMNPT piezoelectric layer.

Implementations may have, but are not limited to, one or more of the following advantages.

A device that includes a layer of PMNPT can be fabricated in a commercially viable process. The layer stack on which the PMNPT layer is fabricated permits good adhesion to an underlying semiconductor wafer. The layer of PMNPT can deposited by physical vapor deposition, which can provide high purity, good throughput and low costs. The layer stack permits the PMNPT material to be fabricated with highly (001) oriented columnar grains, which can provide a superior d33 coefficient. The process can also limit the presence of parasitic phases such as PbOx and pyrochlore, which can be detrimental to the piezoelectric properties.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Machining a piezoelectric layer from a bulk crystal and depositing a piezoelectric layer using sol-gel techniques are slow processes that are not conducive to being performed in a semiconductor fabrication plant. Bulk crystals need to be machined in conventional machine shops. This is not only expensive but also limits the ability of the piezoelectric layer to be integrated into devices. Sol-gel processes require multiple rounds of deposition and curing, thus making it time-consuming. Thus, deposition of a piezoelectric material by a physical vapor deposition process, e.g., sputtering, would be desirable.

As noted above, PMNPT can provide improved piezoelectric properties over the conventional PZT-based solutions. However, fabrication of thin films of PMNPT by physical vapor deposition over large area semiconductor wafers, e.g., silicon wafers, has been challenging. The films of PMNPT can be difficult to provide a uniform crystalline structure with the desired phase with the desired texture.

A technique that may address these issues is to deposit a layer stack on the semiconductor wafer that includes silicon oxide, a metal oxide, a platinum layer, and a thin seed layer. The PMNPT layer is deposited on this layer stack. The layer stack can provide good adhesion to the silicon wafer, while also promoting proper crystalline orientation of the PMNPT.

Figure 1:
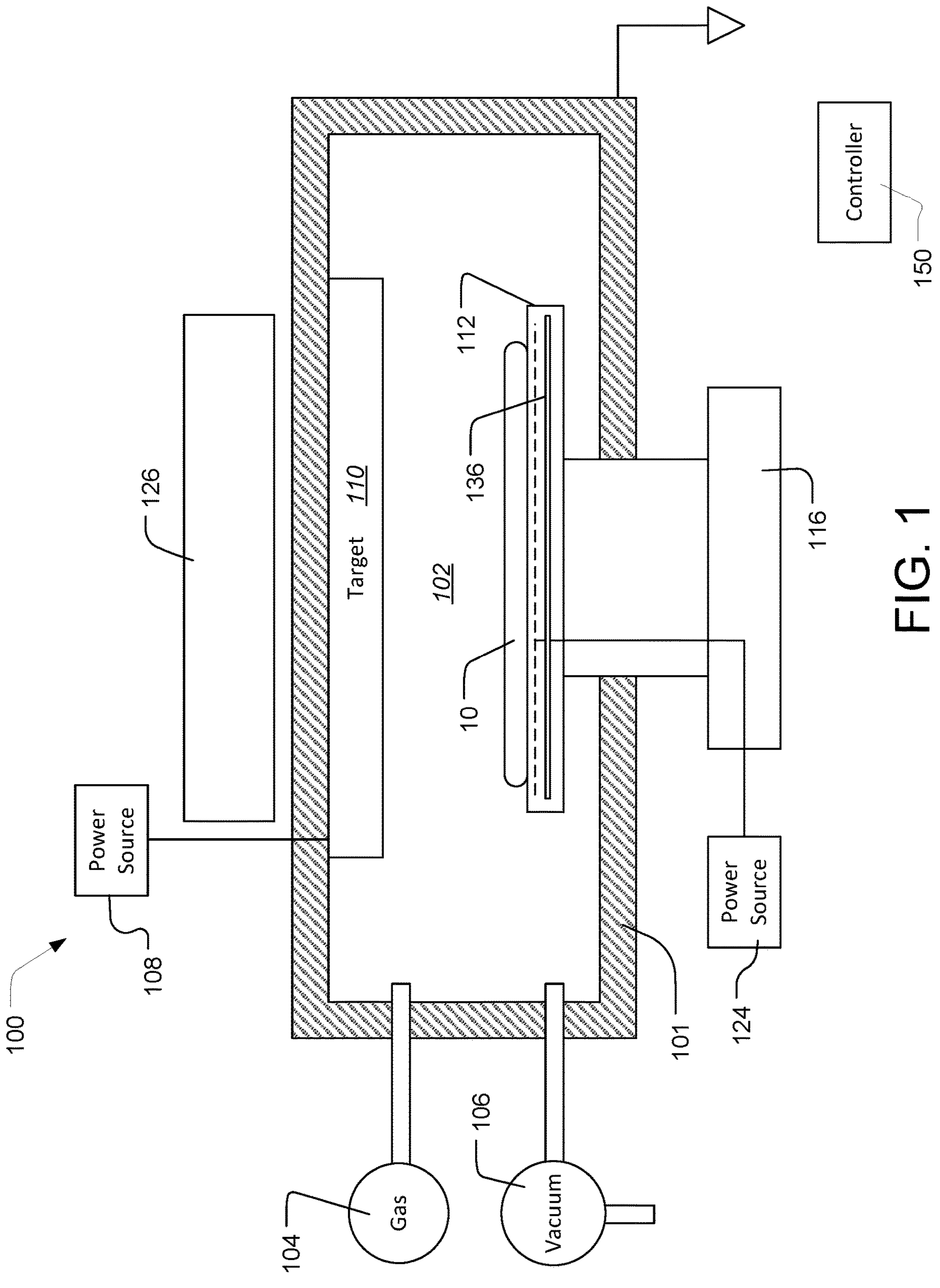
FIG. 1 is a schematic cross-sectional view of a physical vapor deposition processing chamber.

FIG. 1 depicts a schematic representation of a chamber 100 of an integrated processing system, e.g., an ENDURA system, suitable for practicing the physical vapor deposition process discussed below. The processing system can include multiple chambers, which can be adapted for PVD or CVD processes. For example, the processing system can include a cluster of interconnected process chambers, for example, a CVD chamber and a PVD chamber.

The chamber 100 includes chamber walls 101 that surround a vacuum chamber 102, a gas source 104, a pumping system 106 and a target power source 108. Inside the vacuum chamber 102 is a target 110 and a pedestal 112 to support the substrate 10. A shield can be placed inside the chamber to enclose a reaction zone. The pedestal can be vertically movable, and a lift mechanism 116 can be coupled to the pedestal 112 to position the pedestal 112 relative to the target 110. A heater or chiller 136, e.g., a resistive heater or a thermoelectric chiller, can be embedded in the pedestal 112 to maintain the substrate 10 at a desired process temperature.

The target 110 is composed of the material to be deposited, e.g., lead magnesium niobate-lead titanate for PMNPT. However, the target can have an excess of $PbO_x$ relative to the desired stoichiometry for the layer to be deposited to account for the loss of lead due to its volatile nature during either deposition or post-processing, such as annealing step. For example, the target can have an excess of PbO of 1-20 mol %. to account for the loss of volatile Pb and $PbO_x$ from the deposited material. The target itself should be of homogenous composition. The target 110 can be platinum (Pt) or Titanium (Ti) for deposition of other layers.

The gas source 104 can introduce an inert gas, e.g., argon (Ar) or xenon (Xe), or a mixture of an inert gas with a processing gas, e.g., oxygen, into the vacuum chamber 102. The chamber pressure is controlled by the pumping system 106. The target power source 108 may include a DC source, a radio frequency (RF) source, or a DC-pulsed source.

In operation, the substrate 10 is supported within the chamber 102 by the pedestal 112, gas from the source 104 flows into the chamber 102, and the target power source 108 applies power to the target 110 at a frequency and voltage to generate a plasma in the chamber 102. The target materials are sputtered from the target 110 by the plasma, and deposited on the substrate 10.

If the target power source 108 is DC or DC-pulsed, then the target 110 acts as a negatively biased cathode and the shield is a grounded anode. For example, a plasma is generated from the inert gas by applying a DC bias to the sputtering target 210 sufficient to generate a power density of about 1 to 350 Watts per square inch, e.g., 100-38,000 W for a 13 inch diameter target, and more typically about 100-10,000 W. If the target power source 108 is an RF source, then the shield is typically grounded and the voltage at the target 110 varies relative to the shield at a radio frequency, typically 13.56 MHz. In this case, electrons in the plasma accumulate at the target 110 to create a self-bias voltage that negatively biases the target 110.

The chamber 100 may include additional components for improving the sputtering deposition process. For example, a power source 124 may be coupled to the pedestal 112 for biasing the substrate 10, in order to control the deposition of the film on the substrate 10. The power source 124 is typically an AC source having a frequency of, for example, between about 350 to about 450 kHz. When the bias is applied by the power source 124, a negative DC offset is created (due to electron accumulation) at the substrate 10 and the pedestal 112. The negative bias at the substrate 10 attracts sputtered target material that becomes ionized. The target material is generally attracted to the substrate 10 in a direction that is substantially orthogonal to the substrate 10. As such, the bias power source 124 improves the step coverage of deposited material compared to an unbiased substrate 10.

The chamber 100 may also have a magnet 126 or magnetic sub-assembly positioned behind the target 110 for creating a magnetic field proximate to the target 1210. In some implementations, the magnet rotates during the deposition process.

The operation of the chamber can be controlled by a controller 150, e.g., a dedicated microprocessor, e.g., an ASIC, or a conventional computer system executing a computer program stored in a non-volatile computer readable medium. The controller 150 can include a central processor unit (CPU) and memory containing the associated control software.

Figure 2:
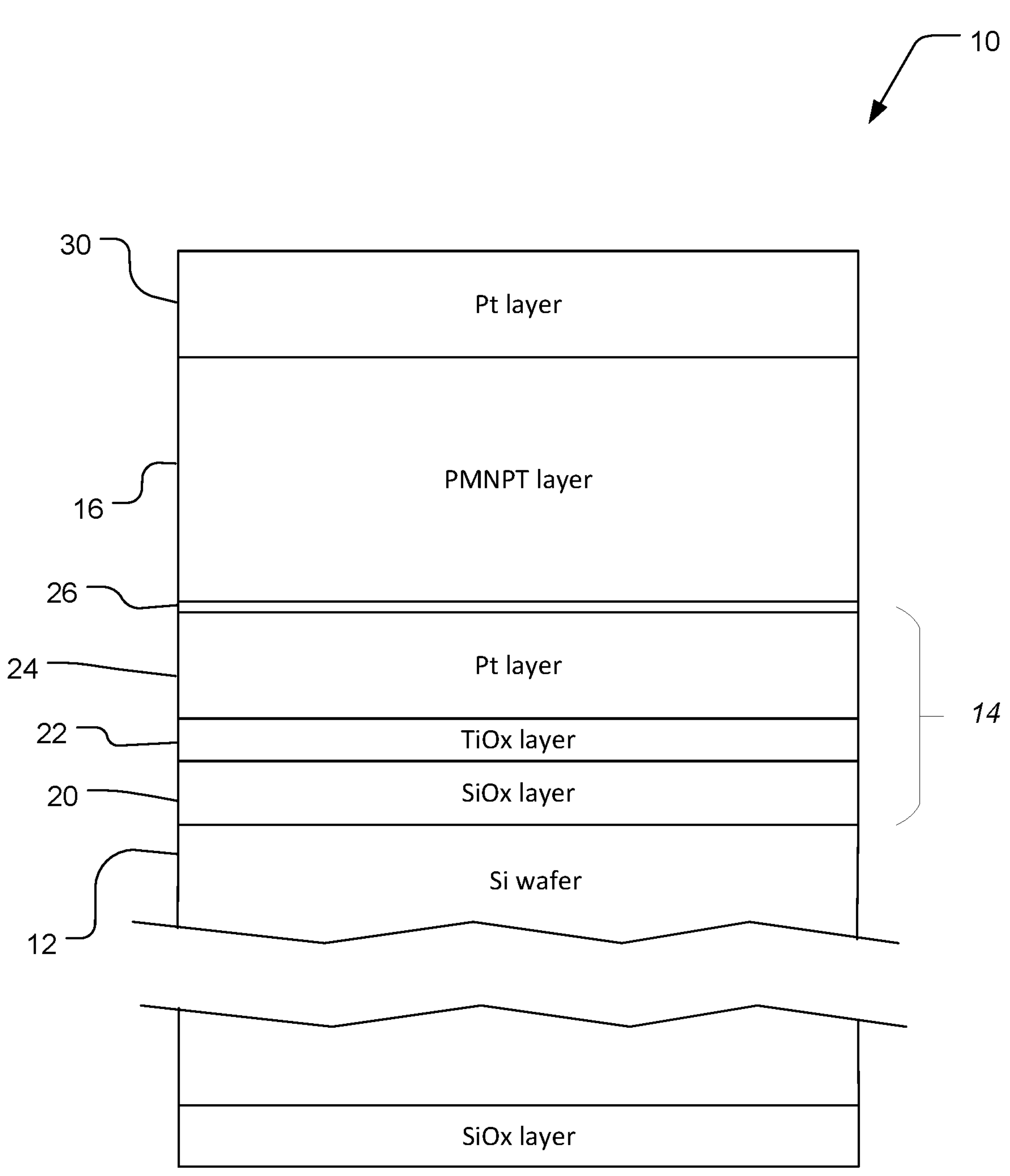
FIG. 2 illustrates a cross-section of a portion of a device that includes a piezoelectric layer of PMNPT.

FIG. 2 illustrates a cross-section of a portion of a substrate 10 for fabrication of a device that includes a piezoelectric layer 16 of PMNPT formed on a semiconductor wafer 12. In particular, the substrate 10 includes a layer stack 14 between the semiconductor wafer 12 and the piezoelectric layer 16. The layer stack 14 can both improve adhesion of the piezoelectric material to the semiconductor wafer 12, and promote proper crystalline orientation of the PMNPT material in the piezoelectric layer 16.

The semiconductor wafer can be a silicon wafer or another semiconductor such as germanium (Ge). The silicon wafer can be a single crystal silicon wafer, and can have a <001> crystallographic orientation, although other orientations can work.

The layer stack 14 includes, in order, a silicon oxide (SiOx) layer 20, an adhesion layer 22, a first conductive layer 24, and a first seed layer 26 that provides a seed layer for the PMNPT layer. The adhesion layer 22 can be a metal oxide, e.g., titanium oxide, and the seed layer can also be metal oxide, e.g., titanium oxide or niobium oxide.

The silicon oxide layer 20 can include $SiO_2$, SiO, or a combination thereof. The silicon oxide layer 20 can be a thermal oxide, and can have a thickness of about 50-1000 nm. The silicon oxide layer 20 can be an amorphous layer.

The adhesion layer 22 can be a metal oxide layer. The stoichiometry of the metal oxide layer can $MO_2$, $M_2O_3$, or MO (with M representing the metal element), or another suitable stoichiometry of the metal and oxygen. In particular, the adhesion layer 22 can be formed of titanium oxide, e.g., $TiO_2$, $Ti_2O_3$, TiO, or anther stoichiometry of titanium and oxygen. In some implementations, rather than a metal oxide layer, the adhesion is a pure metal or a metal alloy. Examples for the metal (either for the metal of the metal oxide, or for the pure metal or component of the metal alloy) include titanium, chromium, chromium-nickel, and nickel. The adhesion layer 22 can be thinner than the silicon oxide layer 20. For example, a titanium oxide adhesion layer 22 can have a thickness of 25-40 nm. The adhesion layer 22 can have a crystallographic orientation for facilitating a desired crystallographic orientation of the conducive layer 24. For example, a $TiO_2$ layer can have a <001> orientation to facility a Pt<111> orientation.

The first conductive layer 24 is formed of a conductive material such as platinum, gold, iridium, molybdenum, SrRuO3. The first conductive layer 24 can be thicker than the adhesion layer 22, and can be thicker than the silicon oxide layer 20. For example, the first conductive layer 24 can have a thickness of 50-300 nm. The first conductive layer 24 can have a crystallographic orientation for facilitating a desired crystallographic orientation of the seed layer 26. For example, a platinum layer can have a <111> crystallographic orientation to facilitate a <111> orientation in a titanium oxide seed layer.

The seed layer 26 can be metal oxide. In particular, the seed layer 24 can be an oxide of titanium or niobium. For example, the seed layer 26 can be $TiO_2$, $Ti_2O_3$, TiO, or another stoichiometry of titanium and oxygen. The seed layer 26 should have a uniform stoichiometry across the surface of the substrate 10. The seed layer 26 can have a crystallographic orientation for facilitating a desired crystallographic orientation of the piezoelectric layer 28. For example, a titanium oxide layer can have a <001> crystallographic orientation to facilitate a <001> orientation in a PMNPT piezoelectric layer. The seed layer 26 is thinner than the adhesion layer 22. For example, first seed layer 26 can be about 1-5 nm, thick, e.g., 2 nm.

The piezoelectric layer 16 is formed on the seed layer 26. Examples of material for the piezoelectric layer 16 include PZT and relaxor-PT materials. In particular, the material can be $(1-x)[Pb(Mg_{(1-y)}Nb_y)O_3]-x[PbTiO_3]$, where x is about 0.2 to 0.8, and y is about 0.8 to 0.2, e.g., about ⅔. Due to the presence of the metal oxide seed layer, the PMNPT material can be predominantly, e.g., substantially entirely, a <001> crystallographic orientation. The piezoelectric layer can have a thickness of 50 nm to 10 microns.

A second conductive layer 30 is formed on the piezoelectric layer 16. The second conductive layer 30 can be the same material composition as the first conductive layer 24, and can be the same thickness as the first conductive layer 24. For example, the second conductive layer 30 can be platinum, and can have a thickness of 50-300 nm.

A voltage can be applied between the first and second conductive layers, 24 and 30, in order to actuate the piezoelectric layer 16. Thus, the first conductive layer provides 24 a lower electrode and the second conductive layer 30 provides an upper electrode with the piezoelectric layer 16 sandwiched therebetween.

To fabricate the layer stack 14, an oxide of $SiO_2$ can be grown on a Si <001> single crystal wafer by thermal processing in an oxygen-containing atmosphere. The thermal oxide can be grown to a thickness of 50-1000 nm, e.g., 100 nm. The thermal oxide can be formed on both sides of the silicon wafer.

Thereafter, a metal layer which will provide the metal of the adhesion layer is deposited by PVD. For example, a titanium layer can be deposited. For example, the metal layer can be deposited with the substrate between room temperature and 600° C. and a power density of 1 to 350 Watts per square inch, e.g., about 1.5 Watts per square inch, applied to the target. Deposition of the metal layer can be followed by annealing in a rapid thermal processing chamber or furnace in the presence of oxygen or air to form the adhesion layer in the form of the metal oxide layer, e.g., TiOx. The annealing can be at a temperature of 500-800° C., e.g., for 2-30 minutes. The resulting adhesion layer can have a thickness of 5-400 nm.

Then the first conductive layer, e.g., the highly oriented platinum <111> film, is deposited by PVD on the adhesion layer, e.g., on the titanium oxide layer. For example, a platinum layer can be deposited at a substrate temperature of room temperature to 500° C., with a power density of 0.5 to 20 Watts per square inch, e.g., 4-5 Watts per square inch, applied to the target. Deposition of the bottom metallic layer can proceed until the layer has a thickness of 50-300 nm. The adhesion layer provides improved adhesion between the metallic electrode and the silicon oxide, in addition to helping in uniform texturing of the metallic layer.

Next, a thin metal layer e.g., titanium, is deposited on the lower electrode, e.g., the platinum layer, by a PVD (e.g., DC sputtering) or a CVD (e.g., ALD) technique. In particular, a titanium layer can be deposited, e.g., by DC sputtering. For example, the titanium seed layer can be deposited with the substrate at room temperature to 500 C and a power density of 0.5 to 4 Watts per square inch, e.g., 1 Watt per square inch, applied to the target. The thin metal layer can have a thickness of 1-5 nm. The thin metal layer can then be oxidized, e.g., heated in an oxidizing atmosphere to convert the metal layer to a metal oxide, e.g., convert Ti to TiOx, to provide the seed layer. Additionally, the oxidized seed layer can also be deposited directly by a PVD or CVD technique, e.g., TiOx deposition by RF sputtering or ALD.

The PMNPT layer is then deposited on the seed layer by 22 by PVD. For example, the PMNPT layer can be deposited at a substrate temperature of up to 800° C., e.g., up to 800° C., with a power density of 4 to 40 Watts per square inch.

Finally, a second conductive layer, e.g., a platinum film, is deposited by PVD on the PMNPT layer. For example, the second platinum film can be deposited under the same conditions as the first platinum film.

Thus, the final device includes a stack that consists of 1) a wafer, e.g., a single crystal silicon wafer of <001> crystallographic orientation, 2) a layer of thermal oxide, e.g., silicon oxide, 3) an adhesion layer, e.g., of titanium oxide, 4) a first conductive layer, e.g., Pt<111> of crystallographic orientation, that provides a bottom electrode, 5) a seed layer, e.g., an titanium oxide seed layer, 6) a PMNPT layer of <001> crystallographic orientation, and 7) a second conductive layer, e.g., a platinum layer, that provides a top electrode.

Without being limited to any particular theory, the favorable lattice match between adhesion layer, e.g., TiOx <001> and bottom electrode, e.g., Pt permits the growth of highly oriented bottom metallic electrode, e.g., Pt<111> grains. And the highly oriented bottom metallic electrode, e.g., platinum <111> film permits the formation of a piezoelectric layer having highly oriented PMNPT <001> grains. This stack can also limit the presence of parasitic phases such as PbOx and pyrochlore, which are detrimental to the piezoelectric properties.

A number of embodiments have been described. Nevertheless, it will be understood that various modifications may be made without departing from the spirit and scope of the disclosure. For example,

- The system 100 illustrated in FIG. 1 is suitable for processing a planar substrate 10, such as a semiconductor substrate, e.g., a silicon wafer, but the techniques discussed below could be adapted to non-planar substrate.
- The PVD process can use a self-ionized plasma (SIP). In the SIP process, a plasma is initially ignited using an inert gas such as argon. After plasma ignition, the inert gas flow is terminated, and the deposition plasma is maintained by ions generated from the sputtering target.
- The upper electrode could be a different conductive material than the lower electrode, e.g., a conductive material other than platinum.

Accordingly, other embodiments are within the scope of the following claims.

What is claimed is:

1. A piezoelectric device, comprising:

a substrate;

a thermal oxide layer on a surface of the substrate;

a metal adhesion layer on the thermal oxide layer, wherein the metal adhesion layer consists of metallic chromium, metallic nickel, or a metallic alloy of chromium and nickel;

a lower electrode on the metal adhesion layer on the thermal oxide layer, wherein the metal adhesion layer and the lower electrode are composed of different materials;

a seed layer on the lower electrode, wherein the seed layer is titanium oxide or niobium oxide;

a lead magnesium niobate-lead titanate (PMNPT) piezoelectric layer on the seed layer, wherein the PMNPT piezoelectric layer is composed of columnar grains of <001> crystallographic orientation with respect to the surface of the substrate; and an upper electrode on the PMNPT piezoelectric layer.

2. The piezoelectric device of claim 1, wherein the substrate comprises a silicon substrate and the thermal oxide layer is silicon oxide.

3. The piezoelectric device of claim 1, wherein the lower electrode is composed of platinum.

4. The piezoelectric device of claim 1, wherein the PMNPT piezoelectric layer is composed of (1-x) $[Pb(Mg_{1/3}Nb_{2/3})O_3]$-x$[PbTiO_3]$, where x is about 0.2 to 0.8, and y is about 0.8 to 0.2.

5. The piezoelectric device of claim 3, wherein the upper electrode has a same composition as the lower electrode.

6. A method of fabricating a piezoelectric device, comprising:

forming, on a surface of a substrate, an adhesion layer on a thermal layer of the substrate by depositing metallic titanium, metallic chromium, metallic nickel, or a metallic combination thereof;

depositing a lower electrode on the adhesion layer, wherein the adhesion layer and the lower electrode are composed of different materials;

forming a seed layer on the lower electrode, wherein the seed layer is titanium oxide or niobium oxide;

depositing a lead magnesium niobate-lead titanate (PMNPT) piezoelectric layer on the seed layer by physical vapor deposition, wherein PMNPT piezoelectric layer is composed of columnar grains of <001> crystallographic orientation with respect to the surface of the substrate after deposition; and depositing an upper electrode on the PMNPT piezoelectric layer.

7. The method of claim 6, comprising depositing the adhesion layer with the substrate at 20-25° C.

8. The method of claim 6, wherein forming the seed layer includes depositing a metal layer and annealing the substrate to convert at least a portion of the metal layer to a metal oxide seed layer.

9. The method of claim 8, wherein forming the adhesion layer, depositing the lower electrode and forming the seed layer comprise physical vapor depositions.

10. The method of claim 6, wherein forming the adhesion layer comprises forming a metal layer.

11. A piezoelectric device, comprising:

a single crystal silicon wafer having a <001> crystallographic orientation with respect to a surface of the single crystal silicon wafer;

a silicon oxide layer on the single crystal silicon wafer;

a titanium oxide adhesion layer on the silicon oxide layer, the titanium oxide adhesion layer having a thickness of 25-40 nm;

a platinum lower electrode of <111> crystallographic orientation on the titanium oxide adhesion layer;

a seed layer on the platinum lower electrode, the seed layer consisting of titanium oxide and having a thickness of 1-5 nm;

a lead magnesium niobate-lead titanate (PMNPT) piezoelectric layer of <001> crystallographic orientation with respect to the surface of the single crystal silicon wafer on the seed layer; and a platinum upper electrode with a first surface contacting the PMNPT piezoelectric layer, wherein a second surface of the platinum upper electrode opposite the first surface is an exposed surface of the piezoelectric device.

12. The piezoelectric device of claim 11, wherein the silicon oxide layer directly contacts the single crystal silicon wafer.

* * * * *